United States Patent [19]
DiStefano

[11] 3,972,059
[45] July 27, 1976

[54] DIELECTRIC DIODE, FABRICATION THEREOF, AND CHARGE STORE MEMORY THEREWITH

[75] Inventor: Thomas Herman DiStefano, Tarrytown, N.Y.

[73] Assignee: International Business Machines Corporation, Armonk, N.Y.

[22] Filed: Dec. 28, 1973

[21] Appl. No.: 429,460

[52] U.S. Cl. ................................. 357/6; 357/10; 357/12; 357/54
[51] Int. Cl.² ................. H01L 49/02; H01L 29/12; H01L 29/88; H01L 29/34
[58] Field of Search ...................... 357/6, 10, 12, 54

[56] References Cited
UNITED STATES PATENTS

| | | | |
|---|---|---|---|
| 3,398,021 | 8/1968 | Lehrer et al. | 357/6 |
| 3,500,142 | 3/1970 | Kahng | 357/6 |
| 3,758,797 | 9/1973 | Peterson | 357/6 |

*Primary Examiner*—Edward J. Wojciechowicz
*Attorney, Agent, or Firm*—Bernard N. Wiener

[57] ABSTRACT

A dielectric diode is provided in accordance with the principles of this invention. The dielectric diode is in the form of a capacitor wherein one of the electrodes has a high contact barrier, e.g., 4 electron-volts, and the other has a low contact barrier, e.g., 1 electron-volt, giving the resulting structure a diode behavior. Illustratively, the electrode at the low contact barrier comprises a valve metal or a very reactive metal which has been anodized or oxidized to provide a layer region with a given concentration of positive ions. The resulting metal oxide is covered with a wide band gap insulator such as $SiO_2$. The composite contact barrier from the conductor to the insulator is typically less than 1 eV and results from the transition layer region between the conductor electrode and the insulator layer. The wide gap insulator layer is covered on the opposite surface with another electrode which has a high contact barrier. Electronic current will tunnel easily from the first electrode into the insulator layer via the composite contact barrier and then will be collected by the second electrode as a relatively large tunnel current. However, the tunnel current from the second electrode, through the insulator and to the first electrode is relatively quite small at electric fields less than $10^6$ volts/cm.

A dielectric diode provided in accordance with the principles of this invention can be used to charge and discharge a capacitor, forming a memory cell. The charge on the memory capacitor can be sensed by a field effect transistor.

6 Claims, 13 Drawing Figures

FIG. 2A
FORWARD BIAS

FIG. 2B
REVERSE BIAS

DIELECTRIC DIODE, FABRICATION THEREOF, AND CHARGE STORE MEMORY THEREWITH

BACKGROUND OF THE INVENTION

It is known in the prior art that information can be stored in the form of charge on a capacitor having an insulator layer with respective metal or semiconductor electrodes on the opposite faces thereof. A memory system based on stored charge is attractive for computer technology because of the small number of components required for storage of each bit of information. The stored information in the form of charge on the capacitor will last for an indefinite period of time if the associated circuitry does not cause the stored charge to decay by a leakage of charge from the capacitor. Heretofore, convenient technology was not known which could be used to charge and discharge the storage capacitor without introducing a large amount of leakage current. It is desirable to have a technology for rapidly charging and discharging a storage capacitor so that a simple and small non-volatile random access memory could be produced or fabricated using charge storage. One known system for charging and discharging a capacitor involves the use of diodes with low reverse leakage current in the charging and discharging circuit paths. A dielectric diode provided in accordance with the principles of this invention has a sufficiently low leakage current to permit it to be used successfully in combination with a capacitor to form a non-volatile charge store memory cell or unit.

The nature and function of illustrative background literature which is of general interest for the practice of this invention is presented as follows:

a. D. Kahng and S. M. Sze, "A Floating Gate and Its Application to Memory Devices," *The Bell System Technical Journal* Vol. 46, No. 6, July–August, 1967, pp. 1288–1295. Kahng and Sze describe a non-volatile semiconductor memory utilizing charge storage on a capacitor in the form of a floating or unconnected gate electrode. Charge is applied to this floating gate by the injection of electrons from an auxiliary electrode, through an insulating layer, and onto the floating gate. It is necessary that electrons are more easily injected from the first electrode, through the insulator, to the second electrode, than they are from the floating gate to the third electrode. It is postulated by Kahng and Sze that this condition can be met by making the energy barrier on the insulator between the first two electrodes greater than that on the insulator between the floating gate and the third electrode. However, Kahng and Sze do not disclose the use of a dielectric diode with low reverse leakage as an integral part of the floating gate memory cell. The charge retention time of the device of Kahng and Sze is short, because of the leakage of current from the storage capacitor through the insulator and back to the electrode used for charging the capacitor, and is insufficient for a capacitor memory cell with a long charge retention time.

b. R. Williams, "Photoemission of Electrons from Silicon into Silicon Dioxide: Effects of Iron Migration in the Oxide", *Journal of Applied Physics*, Vol. 37, No. 4, Mar. 15, 1966, pp. 1491–1494. Williams describes experiments done on the system Si—SiO$_2$—Au in a sandwich structure. He introduced sodium ions into the SiO$_2$ by electrolytically depositing them onto the silicon surface. He found that there resulted an enhanced photoemission from the silicon surface due to the presence of sodium ions. He describes this in terms of a change in the silicon itself which produces the enhanced photoemission. Further, it has been determined in considerations for this invention that when a structure as shown by Williams is either forward-biased or backward-biased dielectric diode behavior cannot be obtained. The structure described by Williams is not a dielectric diode because the contact barrier on the silicon is not significantly different from that on the counter electrode. The contact barrier on the silicon is about 2.9 eV while the contact barrier on the gold is about 3.8 eV. Since both barriers are high and not greatly different, the rectification of this unit is insignificant. Williams does not disclose either the fabrication or the operation of a rectifying device. Further, the noted structure of R. Williams is not stable because the sodium atoms migrate freely at room temperature and change the characteristics of the structure. The sodium migrates from the silicon surface of the aluminum electrode and lowers the contact barrier thereat and changes the directionality of the structure.

OBJECTS OF THE INVENTION

It is an object of this invention to provide a rectifying diode which incorporates an insulator region in the current path, i.e., a dielectric diode.

It is another object of this invention to provide a dielectric diode in accordance with the principles of this invention having two electrodes and an insulating layer therebetween with a low energy barrier at one electrode and a high energy barrier at the other electrode.

It is another object of this invention to provide an apparatus for charge storage comprising a dielectric diode and a capacitor.

It is another object of this invention to combine at least two dielectric diodes and a capacitor in a memory cell.

It is another object of this invention to provide a charge storage cell incorporating a capacitor and a dielectric diode in accordance with the principles of this invention which is suitable for storage of information.

It is another object of this invention to provide an information storage cell incorporating a capacitor and a dielectric diode in accordance with the principles of this invention suitable for operation in a read only mode.

It is another object of this invention to provide a dielectric diode with a low energy barrier at one electrode thereof by a procedure selected from the group consisting of:

a. ion implantation into the surface of the insulator layer proximate to said one electrode surface;

b. chemically reducing the insulator surface before application thereto of the contact electrode thereat;

c. anodizing one electrode to provide an oxide layer thereon proximate thereto the insulator layer of said dielectric diode;

d. sputtering or evaporating of the electrode contact material under a relatively high accelerating field so that atoms of said contact material are introduced into the surface layer of the insulator; and e. reaction of the insulator layer and the adjacent electrode forming therebetween a low energy barrier via either a physical reaction or a chemical reaction.

It is another object of this invention to provide a memory cell capable of being operated in a write, read and erase operation, said memory cell comprising two dielectric diodes in accordance with the principles of this invention in combination with a charge storage means and a means for sensing the stored charge on the capacitor.

It is another object of this invention to provide the memory cell of the aforegoing object in which the storage means is selected from the group consisting of a capacitor and a transistor.

It is another object of this invention to provide the memory cell of the foregoing object in which the transistor is a field-effect transistor.

The foregoing and other objects, features and advantages of the invention will be apparent from the following more particular description of preferred embodiments of the invention, as illustrated in the accompanying drawings.

SUMMARY OF THE INVENTION

A dielectric diode in accordance with the principles of this invention is a sandwich device comprising the layers conductor-insulator-conductor. The junction between the insulator and one of the conductors is treated so that it will inject electrons into the insulator via the treated region or transition layer region. Current flows easily in only one direction in the insulator because only one of the junctions is treated to allow easy injection of electrons. Treatment of the junction at the one electrode involves the introduction of many positive ions in a manner that they do not move significantly during current flow or at operational temperature of this dielectric diode into the surface layer region of the insulator. The electric field produced by these ions lowers the electronic barrier from the conductor into the insulator, and allows easy electron injection therein via Fowler-Nordheim tunneling.

Fabrication of the Dielectric Diode

Specific dielectric diode structures in accordance with the principles of this invention are fabricated by treating either the conductor and/or the insulator at the interface to allow easy injection of electrons into the insulator.

The treatment in one instance is the implantation of ions selected from the exemplary group comprising Rb, Cs, Al, Mg, Ca, Ba, Sr, Ti, Ta, W, Cr, and Y into the insulator surface region either before or after the electrode is applied thereto. In another instance, the ions are produced by reducing the insulator surface region before the electrode is applied thereto. In another instance, the ions are produced by first anodizing the metal contact so that the resulting metal oxide layer thereon is ion rich and then the insulator is established and then the second conductor. In another instance, the ions are injected into the insulator surface region by sputtering or evaporating the material of the metal contact under a high accelerating field. In still another instance, a chemical or physical reaction of the electrode with the insulator is accomplished to establish the transition low energy barrier.

Stored Charge Memory

A dielectric diode, in accordance with the principles of this invention, can be used to charge or discharge a memory cell. Illustratively, the charge on the capacitor can be sensed by a field-effect transistor. An electrode of each capacitor is completely surrounded by a good insulator. Electronic charge is added to or removed from this electrode by means of Fowler-Nordheim injection of electrons into the insulator. The tunnel current in the forward direction is greatly enhanced by a low contact barrier on the cathode electrode. Thus, large tunnel currents from auxiliary electodes are used to charge and discharge the storage capacitor. After the desired charge is applied to the capacitor, the voltages on the auxiliary electrodes are set so that significant electron injection does not take place and the dielectric diode comprising part of the capacitor and the auxiliary electrode is reverse biased. The leakage current of the reverse biased dielectric diode in accordance with the principles of this invention in the reverse bias condition is extremely small so that the stored charge is not removed via leakage current in a reasonably large period of time.

PRINCIPLES OF THE INVENTION

The principles of this invention will now be described in terms of device structure and its operation. The basic device structure is a dielectric diode 10 as represented schematically in FIG. 1A in conjunction with operational circuitry. Essentially, the dielectric diode 10 is a capacitor with metal or semiconductor electrodes 12 and 16. The dielectric diode device 10 is constructed so that electrons can be injected very easily from one electrode 12 into insulator region 14. However, electrons can be injected only with difficulty from the other electrode 16 at interface 17 into insulator region. As a result, the current flows in one direction but not in the other through this structure. An essential principle of the invention is the treatment of a transition layer region 20 from one electrode 12 to insulator 14 which allows electrons to be injected easily into the insulator 14. In the physical structure of the device 10, a conductor 12, an insulator 14, and a third electrode 16 are formed into a sandwich structure 10. On the interface 18 of electrode 12 and on interface 19 of insulator 14, there is a transition layer region 20 between the electrode 12 and the insulator region 14 which allows the electrons to be injected easily from the electrode 12 into the insulator region 14.

Figure 1A:
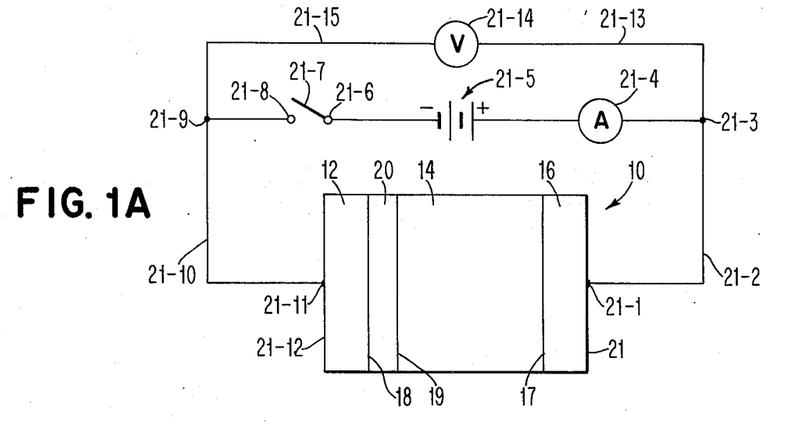
FIG. 1A is a schematic representation of a dielectric diode in accordance with the principles of the invention connected in operational circuitry for providing a voltage across the dielectric diode to cause current flow therein and a voltage monitoring device for ascertaining the voltage drop across the dielectric diode.

The operational circuit of FIG. 1A is completed by connecting outer surface 21 of electrode 16 at contact 21-1 via connector 21-2 to connection point 21-3 whereat there is connected the voltage source and the means for measuring the voltage. The voltage path comprises ammeter 21-4 which is connected at one terminal to contact point 21-3 and at the other contact point to the positive terminal of battery 21-5. The negative terminal of battery 21-5 is connected to switchblade 21-7 at contact point 21-6 with the switchblade 21-7 opening and closing at contact point 21-8 which is in turn connected to the connection point 21-9. The other connection for the voltage to be applied to the dielectric diode 10 of FIG. 1A is applied from connection point 21-9 via connector 21-10 to contact point 21-11 on face 21-12 of electrode 12. The means for measuring the voltage applied to the dielectric diode 10 of FIG. 1A is connected as follows: connection point 21-3 is connected via connector 21-13 to one terminal of voltmeter 21-14 whose other terminal is connected via connector 21-15 to contact point 21-9.

The transition layer region 20 can be made in several ways in accordance with the principles of this invention. Each of the ways to be described hereinafter of producing or fabricating that layer has a common feature. The transition layer region 20 contains a large number of substantially immobile excess positive ions. Fabrication procedures for obtaining transition layer region 20 will be discussed in greater detail later.

Figure 1B:
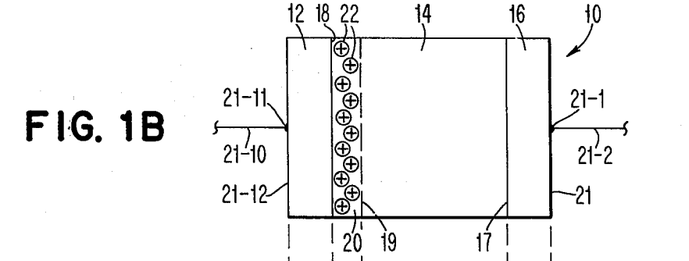
FIG. 1B presents a schematic representation of the dielectric diode of FIG. 1A with the additional aspect therein of an illustration of the positive ions dispersed in the transition region.
Figure 1C:
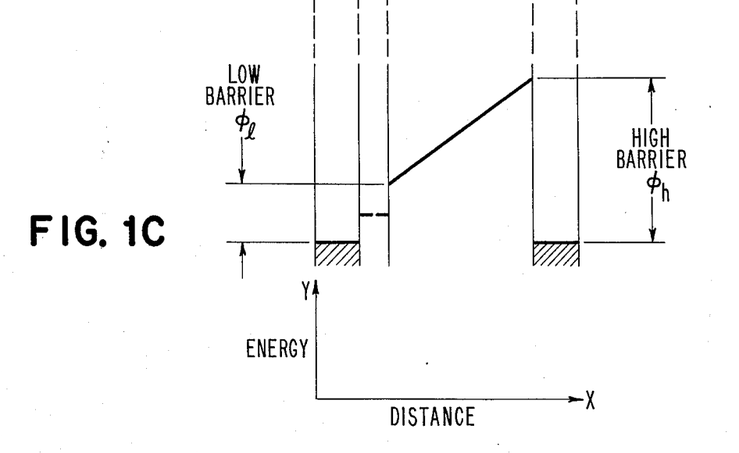
FIG. 1C is an energy diagram illustrating the various energy levels in the several layers of the dielectric diode of FIGS. 1A and 1B characterizing them without the application of the voltage across the dielectric diode.

Reference is made to FIG. 1B for an illustration of the positive ions introduced according to one procedure, in accordance with the principles of this invention. The transition layer region 20 contains a large quantity of positive ions 22 which may be dispersed either homogeneously or in a gradient according to the operational requirements for dielectric diode 10. The energy diagram for the dielectric diode shown in FIG. 1A is shown in FIG. 1C. Energy is along the vertical Y axis and distance is along the horizontal X direction. The barrier for injection of electrons from electrode 12 is small so electrons can tunnel into the insulator region 14 by the path shown by arrow 24. This is the normal Fowler-Nordheim current, for which the following is a formulation:

$$J = \epsilon^2 e^{-\frac{4}{3qn\epsilon} \sqrt{2m^* (q/\phi)^{3/2}}}$$

where
$J$ = current density
$\epsilon$ = electric field
$q$ = electron charge
$n$ = Planck's constant
$\phi$ = contact barrier
$m^*$ = electronic mass in insulator An illustrative reference for a description of prior art understanding of Fowler-Nordheim current is the book *Physics of Semiconductor Devices* by S. M. Sze, particulary page 552 et seq., Wiley-Interscience, John Wiley & Sons, Inc., 1969.

Figure 2A:
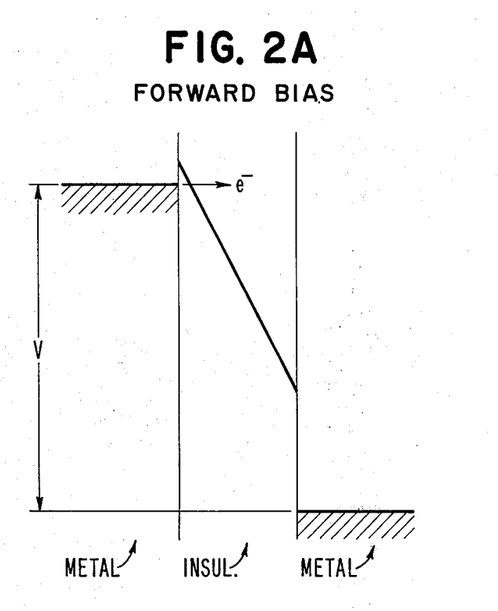
FIG. 2A is an idealized energy diagram illustrating the nature of the Fowler-Nordheim injection of electrons at the low barrier electrode of the dielectric diode under forward bias, in accordance with the principles of this invention.
Figure 2B:
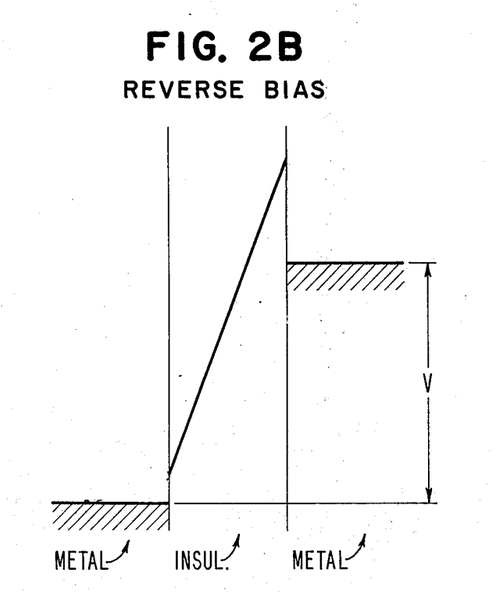
FIG. 2B indicates the absence of significant electron injection at the high barrier electrode of the dielectric diode under reverse bias.
Figure 2C:
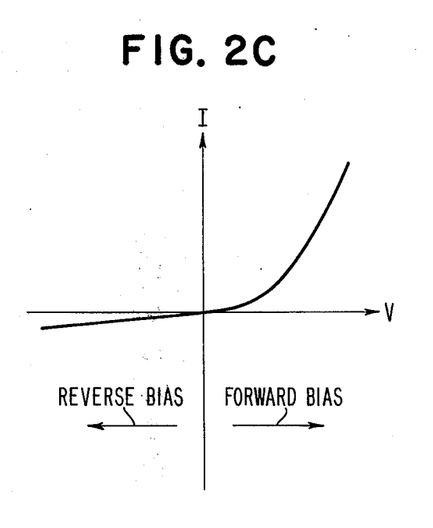
FIG. 2C is a characteristic current-voltage curve for the forward bias and reverse bias conditions illustrated in FIGS. 2A and 2B, respectively, indicating the significant current during the condition of forward bias and the insignificant current during the condition of reverse bias of a dielectric diode in accordance with the principles of this invention.

The current through the device depends solely on the injection current J at the contact barrier due to transition layer region 20 and is not dependent on the conductivity of the insulator region 14. Once electrons are injected into insulator region 14, they are swept through it by the applied electric field due to the applied voltage V of the forward bias. If the polarity of the applied voltage V across the dielectric diode 10 is reversed, electrons are injected not from contact electrode 12, but from contact electrode 16. However, the contact barrier at electrode 16 is much higher than it is for electrode 12 and the Fowler-Nordheim injection current is considerably less than it was in the forward bias case. The forward bias and reverse bias energy conditions for Fowler-Nordheim injection current are illustrated by FIGS. 2A and 2B, respectively. The Fowler-Nordheim injection current depends very strongly on the contact barrier. The contact barriers are illustrated for electrode contacts 12 and 16. Typical number for these contact barriers are about 1 eV for $\phi$-low and about 4 eV for $\phi$-high. This gives a rectification ratio of several orders of magnitude; e.g., $\approx 10^3$, as can be found by substituting the values for the contact barriers $\phi$-high and $\phi$-low into the Fowler-Nordheim equation noted hereinbefore.

A charge store memory in accordance with the principles of this invention will be described with reference to FIGS. 3A, 3B and 3C.

Figure 3A:
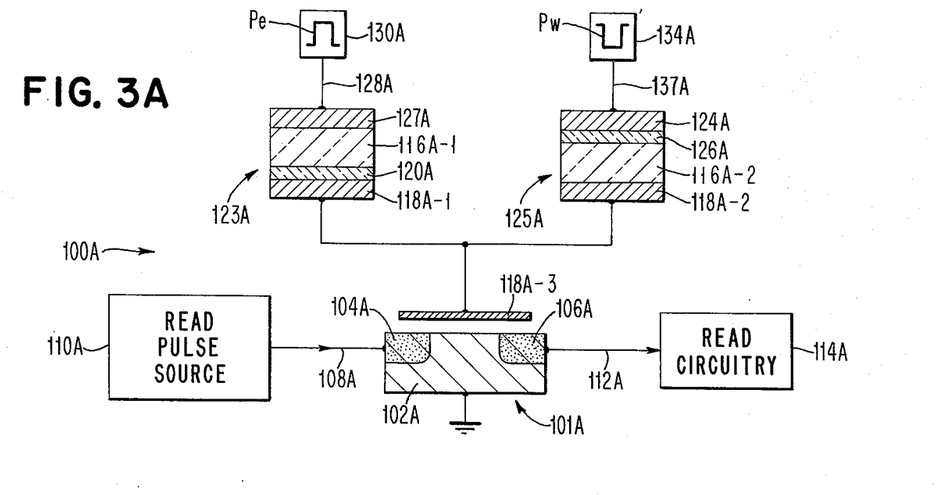
FIG. 3A is a schematic diagram illustrating a charge store memory unit incorporating two dielectric diodes in accordance with the principles of this invention connected to a field-effect transistor (FET) together with associated circuitry for providing the necessary functions for write, erase and read for the stored information in the memory unit.
Figure 3B:
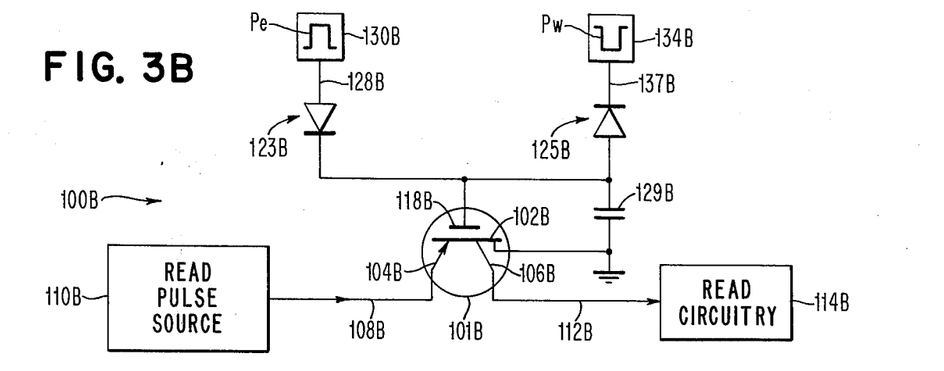
FIG. 3B is a schematic functional diagram incorporating several operational structures of FIG. 3A illustrating their functional relationship.
Figure 3C:
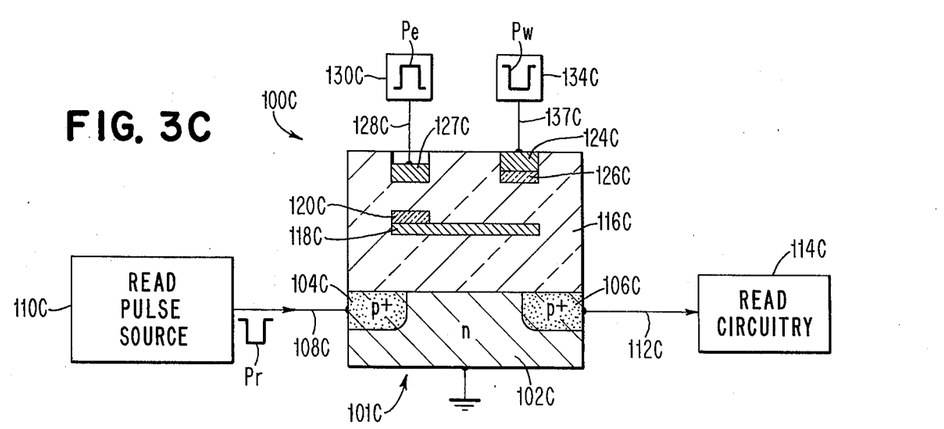
FIG. 3C is a schematic structural diagram of an operational memory unit in accordance with the principles of this invention incorporating two dielectric diodes therein and is comparable to the circuit parameters provided in FIGS. 3A and 3B.

FIG. 3A provides a schematic structural diagram of a charge store memory, FIG. 3B provides a functional diagram of a charge store memory, and FIG. 3C provides an actual structural diagram of a charge store memory, in accordance with the principles of this invention. For clarity of explanation, the elements in each of FIGS. 3A, 3B and 3C are commonly identified with the exception that the numbers of FIG. 3A bear the additional characterization of A, the elements of FIG. 3B have the additional characterization of B, and the elements of FIG. 3C have the characterization of C.

With reference particularly to FIG. 3C, an FET transistor 101C is formed on an n-type silicon surface 102C. The source 104C and drain 106C of that transistor are shown as the cross-hatched areas on the silicon surface. An electrical connection is formed between the p+ source 104C and p+ drain 106C if a charge exists on the floating gate 118C because of the conductivity of the surface channel produced by the image charge. The floating gate 118C is an electrode buried in the $SiO_2$ insulation 116C without any physical connections thereto. The floating gate 118C is situated above the FET transistor 101C in the $SiO_2$ insulation 116C. The transistor 101C can be turned on by putting charge onto the floating gate 118C. This charge is introduced from electrode 124C by putting a negative pulse of voltage on that electrode. With this pulse of negative voltage, electrons are injected from the low work function on electrode 124C, through the insulating $SiO_2$ and onto the floating gate 118C. This injection of electrons from the electrode 124C is made possible by the dielectric diode characteristics thereof. The dielectric diode comprises electrode 124C and part of the floating gate 118C. Once electrons are injected onto the floating gate 118C from electrode 124C, they cannot easily escape therefrom except by coming out through a low work function region 120C of the gate and being collected by electrode 127C. The low work function parts of electrode 124C and of the floating gate 118C are shown by thin cross-hatched regions. These low work function layers on the respective electrode allow easy injection of electrons from that electrode into the $SiO_2$ layer.

The operation of the charge store memory illustrated by FIGS. 3A, 3B and 3C will now be described particularly with reference to FIG. 3C. Initially, there is no charge on the floating gate 118C and transistor 101C is turned off. To write information on the floating gate, a negative pulse Pw is put on electrode 124C and electrons are injected from the electrode through the insulator 116C onto the floating gate 118C where they are trapped. These electrons then turn on the transistor 101C below the floating gate 118C by causing a conducting channel from the source 104C to the drain 106C forming a contact between them. In order to erase this information, the electrons are taken off the floating gate 118C by putting a positive pusle Pe on electrode 127C. This pulls electrons through the low work function part 120C of the floating gate 118C and onto the electrode 127C. As there is then no net charge on the floating gate 118C, the transistor 101C is turned off. If there is no potential on the electrodes 128C and 127C, the electrons will remain on the floating gate 118C indefinitely. Thus, information can be written in by pulsing electrode 124C and the information can be erased by pulsing electrode 127C. The information can be read by detecting current between the source 104C and drain 106C regions of the transistor 101C via read circuitry 114C.

PRACTICE OF THE INVENTION

The procedure for fabrication of embodiments of the invention and the materials useful therefor will now be described. There are several ways of fabricating a dielectric diode in accordance with the principles of this invention, each of which involes providing a transition layer region near the injecting contact electrode which contains a large number of positive ions. The fabrication procedures to be described now involve ways of getting this layer of metal ions near to the cathode electrode which is the electron injecting contact.

Figure 4A:
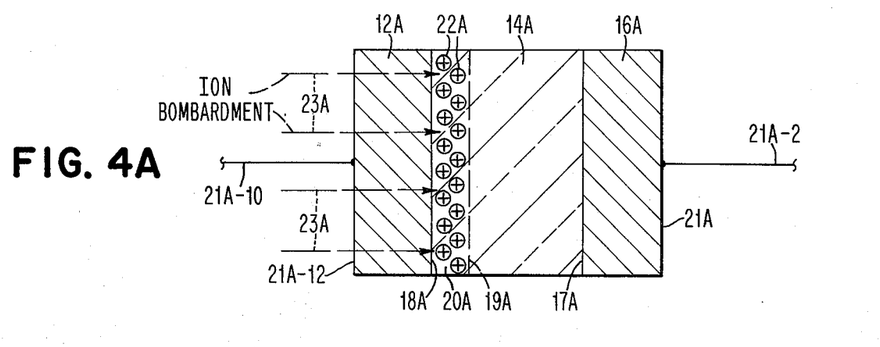
FIG. 4A illustrates one fabrication procedure for obtaining a transition layer region by incorporating therein positive metal ions through ion bombardment, sputtering, or evaporation of the metal contact adjacent to the insulator layer under high accelerating electric field.

A procedure in accordance with the principles of this invention for obtaining a dielectric diode with a large number of positive ions in a layer near the cathode electrode 12A surface 18A is illustrated by FIG. 4A. A good insulator region 14A such as $SiO_2$ is put onto a high work function material 16A such as silicon or gold. Ions 22A are implanted into the surface of the good insulator by either ion bombardment or sputtering or evaporation of a metal under an electric field. This drives a layer of metal ions into the insulating region 14A of $SiO_2$. There is then placed a metal counter-electrode 12A onto insulator region 14A forming the cathode. The ion implantation can be accomplished either before or after the counter-electrode 12A is established in place. As a result there is a counter-electrode cathode 12A with a transition layer region 20A of positive ions 22A near it and forming a low work function barrier and an easy electron injection from the counter-electrode 12A.

Figure 4B:
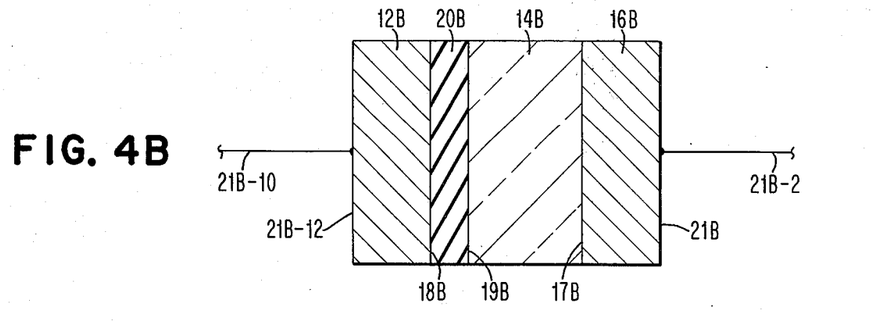
FIG. 4B is an illustration of another fabrication procedure for obtaining layer region which is accomplished by utilizing a valve metal as the electrode at the low energy barrier contact and anodizing that valve metal to obtain a thin layer of metal oxide, and thereafter establishing the insulator layer on the metal oxide; illustratively the valve metal may be niobium, the valve metal oxide may be niobium oxide, and the insulator region may be silicon dioxide or alumina.

Another procedure in accordance with the principles of this invention for providing the low energy barrier as illustrated in FIG. 4B involves anodizing a valve metal 12B to form a valve metal oxide 20B. The layer of valve metal oxide 20B is near the metal oxide interface 18B. Over the valve metal oxide 20B is placed a layer 14B of a very good insulator such as $SiO_2$ or $Al_2O_3$. Because of the nature of thin films of anodized valve metals, the result is a layer of insulator containing a large number of positive ions near a metal surface 18B. This forms an effective low energy barrier for injection of electron from the valve metal 12B into the $SiO_2$ insulator region 14B. A high work function counter-electrode 16B is put on the $SiO_2$ to complete the dielectric diode. Valve metals 12B such as niobium, tantalum, aluminum, vanadium, tungsten, hafnium and manganese can be oxidized by anodization either in liquid or in a plasma to form a thin layer 20B of metal oxide. The thickness of this layer should be from about 10 A to about 100 A. Over metal oxide layer 20B, there is a thicker layer 14B of a good insulator such as $SiO_2$, $Al_2O_3$, or $Si_3N_4$. On top of the good insulator material 14B, there is a high work function material 16B such as gold, tungsten, aluminum, or silicon.

Figure 4C:
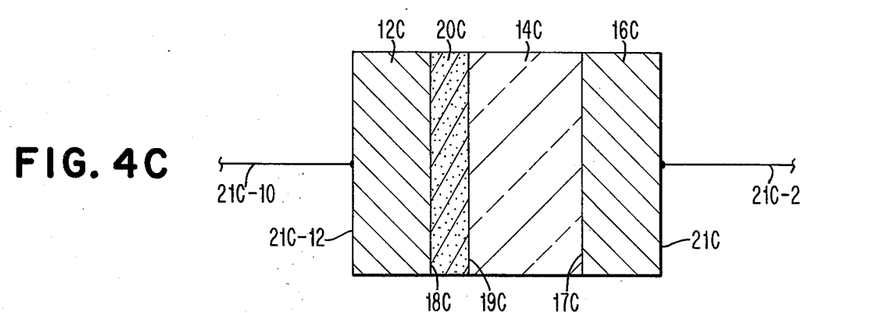
FIG. 4C illustrates another fabrication procedure for obtaining the transition layer region which is a low band gap material that is formed by a reaction between the electrode at the low energy barrier contact with the insulator material or is deposited separately before the application of the electrode.

Another procedure for fabricating a dielectric diode in accordance with the principles of this invention is illustrated in FIG. 4C. The positive charge layer 20C is introduced near the cathode 12C by the formation of a low band gap material between the counter-electrode cathode and the insulating material. The low band gap material can be evaporated, sputtered, or deposited in a very thin layer on the order of 10 A to 100 A thick. Then the counterelectrode 16C is applied to the insulator region 16C.

Another procedure for fabricating a dielectric diode of this invention is illustrated by FIG. 4C. A low band gap material is formed between the counter-electrode 16C and the good insulator 14C to have an interface surface reaction between the counter-electrode metal 12C and the insulator 14C itself. One such reaction is obtained by heating the metal vanadium in contact with the insulator $SiO_2$. This forms an intermediate layer of $V_3Si$ and vanadium oxide. The result is a low contact barrier between the remaining unreacted vanadium and the remaining unreacted $SiO_2$. The physical process for this reaction is described in the article by K. N. Tu et al., "Formation of Vanadium Silicides by the Interaction of V with Bare and Oxidized Si Wafers," *Applied Physics Letters* Vol. 23, No. 9, Nov. 1, 1973, pp. 493–495.

Figure 4D:
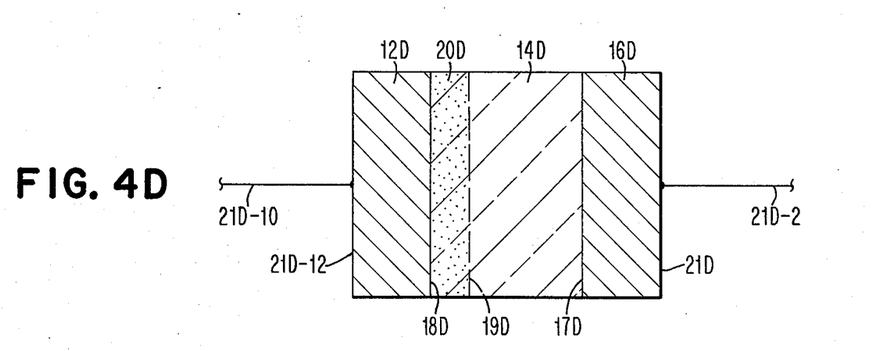
FIG. 4D illustrates another fabrication procedure for obtaining the low barrier transition layer region which is obtained by chemically reducing the insulator layer, e.g., silicon dioxide with hydrogen, thereby depleting the insulating material adjacent to the electrode of oxygen and providing thereby a thin layer which is rich in positive ions leading to a low energy barrier contact.

FIG. 4D illustrates another procedure for fabricating a dielectric diode in accordance with the principle of this invention. An insulator region 14D such as $SiO_2$, $Al_2O_3$, or lead oxide, is put onto a high work function material 16D. The surface of this invention of this insulating material 14D is reduced by heating in a hydrogen environment or in a vacuum. This depletes oxygen from the surface region 20D of the insulator 14D and leaves behind an excess of positive charges 22D in the insulator. A counter-electrode 16D is then applied to this reduced surface to form the completed dielectric diode.

CONSIDERATIONS FOR THE INVENTION

Exemplary considerations for the practice of this invention will be presented with reference to FIG. 1A. If the positive ions 22 in transition layer 20 are made immobile in accordance with the principles of this invention and sufficiently dense, then an embodiment of a stable dielectric diode with low reverse leakage will be obtained. Ions with low drift mobility in $SiO_2$ include Rb, Cs, Ca, Ba, Sr, Ti, Ta, W, Al, Cr, Mg, and Y. A dielectric diode comprising a layer 22 of at least one of the listed species of ions in sufficiently high density and with two electrodes 12 and 16 will operate satisfactorily as a low reverse leakage dielectric diode in accordance with the principles of this invention.

With reference to FIG. 4D, for another embodiment, a 1000 A layer 14D of $SiO_2$ was formed on a silicon electrode 16D. The surface of the $SiO_2$ was reduced by heating the $SiO_2$ in hydrogen gas to about 800°C in order to form a chemically reduced surface layer 20D. An electrode of aluminum metal 12D was then applied to the structure to form a dielectric diode according to the principles of this invention. Current through the structure was found to pass more easily in one direction than in the other direction. This is due to the lower contact barrier at surface 18D due to the layer 20D of reduced $SiO_2$ in contact with the electrode material 12D. The reverse current, in response to a positive voltage applied through connector 21D-10 and a negative voltage applied through connector 21D-2, was found to be immeasurably small. This exemplary embodiment outlined in FIG. 4D was found to function as a dielectric diode in accordance with the principles of this invention with low reverse leakage current. Exemplary operational data for this embodiment are as follows: at 10 volts applied bias, the ratio of the forward current to the reverse current is about $10^6$, and at 20 volts applied bias that ratio is about $10^7$.

To demonstrate that a structure fabricated according to the disclosure of R. Williams, *J.A.P.*, Vol. 37, March 1966, p. 1491 et seq., noted hereinbefore, cannot function as a dielectric diode, an experimental structure, which for clarity of exposition will be discussed with reference to FIG. 1A, was constructed by using silicon as the electrode 12. An insulating layer 14 was grown on the silicon comprising about 1000 A of silicon dioxide. A layer of about $1.3 \times 10^{15}$ sodium ions per square centimeter was introduced into the insulating layer 14 by the evaporation of sodium chloride onto the surface 17. The sodium was drifted under an electric field to the silicon surface 18. This formed a layer 20 of sodium ions with an approximate density of one monolayer on the silicon surface. The thickness of the layer 20 was less than 10 A as determined by theoretical calculations. An electrode 16 was placed on the sample by the evaporation of 150 A of aluminum onto the surface 17 of insulating layer 14. The energy barriers at the two electrodes 12 and 16 were measured by photoemission techniques. The barrier at the silicon electrode on surface 18 was found to be about 1.5 eV and the barrier at surface 17 of electrode 16 was found to be about 3 eV.

The electrical characteristics of this latter structure were obtained at various temperatures. A positive voltage was applied through connector 21-2 and a negative voltage was applied through connector 21-10. A temperature independent forward current was measured at room temperature. The current was found to be about $2.5 \times 10^{-10}$ amps/cm$^2$. This current corresponds to Fowler-Nordheim emission from electrode 12 over the monolayer barrier of sodium ions at surface 18 into the insulator 14. This current was subsequently collected by electrode 16 and measured in the measuring circuitry. The current through the structure in the reverse direction was then measured by applying a positive voltage through connector 21-10 and a negative voltage through connector 21-2. A high reverse leakage current in the reverse direction was caused by the migration of the positive sodium ions 22 in layer 20. The sodium ions 22 were mobile and migrated under the influence of the applied electric field to the surface 17 on electrode 16. Because of this leakage current due to the ion migration this particular structure is not suitable as a stable device. After the ion motion ceased, no measurable reverse current was found for this structure. A significant difference between this structure and the noted disclosure of R. Williams in the cited reference is that the positive ion layer 20 for the present experiment is uniform and dense on surface 18 of electrode 12. The density corresponds to approximately one monolayer of sodium ions on the silicon surface. This high density of sodium ions sufficiently reduces the contact barrier on the silicon 12 to produce a rectifying structure. The structure has the inherent disadvantage that the sodium ions 22 comprising the layer 20 are mobile and will redistribute themselves when an electrical signal is applied to the structure.

What is claimed is:

1. A multilayer diode operable with relatively low reverse bias leakage current and with relatively large forward bias Fowler-Nordheim tunneling current comprising:
   a conductive anode electrode;
   a first insulator layer adjacent to said anode electrode comprised of an insulator selected from the group of insulators consisting of $SiO_2$ and $Al_2O_3$, said insulator layer and said anode electrode having a relatively high contact energy barrier therebetween;

a second insulator layer adjacent to said first insulator layer comprised of an oxide of a metal selected from the group consisting of Nb, Ta, V, W, Hf, and Mn, said second insulator layer including a given concentration of substantially immobile excess positive ions and having thickness less than approximately 100 A; and a metallic cathode electrode comprised of a metal selected from the group of metals consisting of Nb, Ta, Al, V, W, Hf and Mn adjacent to said second insulator layer, said cathode electrode said second insulator layer having a relatively low energy contact barrier therebetween due to said positive ions.

2. A diode as set forth in claim 1 wherein said second insulator layer and said cathode electrode are comprised of the same metal.

3. A diode as set forth in claim 2 wherein said oxide of said second insulator layer is niobium oxide and said metal of said cathode electrode is Nb.

4. A diode as set forth in claim 2 wherein said conductive anode electrode is selected from the group consisting of gold, tungsten, aluminum and silicon.

5. A diode as set forth in claim 2 wherein said second insulator layer has thickness in the approximate range of 10 A to 100 A.

6. A diode as set forth in claim 2 wherein said excess positive ions in said second insulator layer are selected from the group consisting of Rb, Mg, Cs, Ca, Ba, Si, Ti, Ta, Nb, Al, Cr and Y.

* * * * *